United States Patent [19]

Nakane

[11] Patent Number: 4,531,099
[45] Date of Patent: Jul. 23, 1985

[54] AMPLIFIER

[75] Inventor: Hiroshi Nakane, Yokohama, Japan

[73] Assignee: Tokyo Shibaura Denki Kabushiki Kaisha, Kawasaki, Japan

[21] Appl. No.: 486,516

[22] Filed: Apr. 19, 1983

[30] Foreign Application Priority Data

Apr. 20, 1982 [JP] Japan .................... 57-65798

[51] Int. Cl.³ .............................. H03F 3/30
[52] U.S. Cl. .................. 330/267; 330/295; 330/297
[58] Field of Search ........... 330/151, 263, 267, 295, 330/296, 297

[56] References Cited

U.S. PATENT DOCUMENTS

| 3,577,092 | 7/1968 | Kubicz | 330/124 |
| 4,117,418 | 9/1978 | Höglund | 330/296 |
| 4,158,179 | 6/1979 | Sakai et al. | 330/297 |
| 4,236,120 | 11/1980 | White | 330/297 X |
| 4,401,954 | 8/1983 | Suzuki | 330/297 |

FOREIGN PATENT DOCUMENTS 103209 8/1975 Japan .
2066013 7/1981 United Kingdom .

OTHER PUBLICATIONS

P. R. Gray & R. G. Meyer, "Analysis and Design of Analog Integrated Circuits", 1977 John Wiley & Sons, N.Y., p. 160.
Jacob Millmen, "Microelectronics Digital & Analog Circuits & Systems", 1979, McGraw-Hill, N.Y., p. 669.
Herbert Taub & D. Schilling, "Digital Integrated Electronics", 1977, McGraw-Hill, N.Y., p. 517.

Primary Examiner—James B. Mullins
Attorney, Agent, or Firm—Cushman, Darby and Cushman

[57] ABSTRACT

An amplifier includes a differential amplifier which is supplied with a small amplitude signal in a normal condition and a large amplitude signal in an abnormal condition. Resistors and diodes jointly act to judge whether the differential amplifier issues a small or large amplitude signal. A small amplitude signal is amplified by a small amplitude signal-amplifying section and a large amplitude signal is amplified by a large amplitude signal-amplifying section. The large amplitude signal-amplifying section is supplied with a first source voltage $B_2$. The small amplitude signal-amplifying section is impressed with a second source voltage $B_1$. An output signal of the amplifier is supplied to a load A through an output terminal common to the small amplitude signal-amplifying section and large amplitude signal-amplifying section. The first and second source voltages $B_2$, $B_1$ are chosen to have the following relationship:

$B_2 > B_1$.

3 Claims, 3 Drawing Figures

AMPLIFIER

BACKGROUND OF THE INVENTION

This invention relates to an improvement on an amplifier and more particularly to an amplifier adapted to drive an actuator used with an autofocusing mechanism or autotracking mechanism of an optical pickup loaded on, for example, an optical digital audio disc (DAD) player.

Recently, a technique of a digital audio disc (hereinafter referred to as "DAD") has been developed, making it possible to reproduce higher quality sounds than those derived from the conventional analog type. The DAD player which draws out analog audio signals from the DAD scans a plurality of pit tracks spirally formed on the DAD plane by means of, for example, a laser pickup.

As is well known, the plural pit tracks are scanned by various servo mechanisms such as an autofocusing mechanism and an autotracking mechanism.

The autofocusing mechanism is designed to detect the attainment or failure of focusing by, for example, a focusing error detector. A signal denoting errors caused by the focusing error detector is electrically amplified by the drive circuit of a focusing control actuator. Focusing is always assured by controlling the position of an object lens in the laser pickup to be shifted vertical to the DAD plane.

The autotracking mechanism is designed to let a tracking error detector detect the tracking condition. A tracking error output signal from the tracking error detector is amplified by the drive circuit of a tracking control actuator. The best tracking condition is always assured by controlling the laser reflector in the laser pickup to be radial to the DAD plane by means of the actuator.

The actuators for controlling the focusing and tracking generally have input/output transfer characteristics of approximately $-12$ db/oct. Therefore, the higher the frequency of an input signal, the larger the input power required for the actuator.

The output level of an error output signal from an error detector such as a focusing error detector or tracking error detector generally rises with the frequency of the error signal. Consequently, an amplifier of the error signal, for example, an actuator-driving amplifier must have a sufficiently broad dynamic range in a high frequency range. The DAD is sometimes affected by momentarily large external vibrations. To satisfactorily cope with such event, too, the actuator-driving amplifier should have a sufficiently broad dynamic range.

The conventional amplifier applied to the above-mentioned object involves a differential amplifier as a drive section and an SEPP (Single Ended Push-Pull) amplifier consisting of complementary transistors as a power amplifier section. This arrangement assures the issue of an output signal from the power amplifier section to drive the desired load, for example, the above-mentioned actuator. Positive and negative power input terminals of the differential amplifier of the driving section are respectively connected to positive and negative power sources. Also collectors of the complementary transistors of the power amplifier section are respectively connected to the positive and negative power sources. In this case, an error input signal is supplied to an inverted input terminal of the differential amplifier. An output signal from the power amplifier section is delivered to the load and also fed back as a negative feedback signal to a noninverted input terminal of the differential amplifier.

With the conventional actuator driving amplifier of the above-mentioned arrangement, it was necessary in an abnormal case calling for high amplification to provide a sufficiently higher level of positive and negative voltage than in the normal condition when low amplification is carried out in order to assure a sufficiently broad dynamic range. Therefore, such conventional amplifiers which include an SEPP amplifier in the power amplifier section consumed objectionably large power as a whole.

Another known amplifier is the type which is constructed by inserting a parallel circuit consisting of a resistor and capacitor in between the power amplifier section and the load. This amplifier is the type which is intended to protect the load by restricting the flow of a highly amplified signal into the load through a resistor in a low frequency region. A capacitor compensates for a dynamic range in a high frequency region. With respect to the power consumption efficiency, however, the other known amplifier is accompanied with the same drawback as the aforesaid conventional amplifier.

SUMMARY OF THE INVENTION

It is accordingly an object of this invention to provide an improved amplifier to assure a sufficiently broad dynamic range and to elevate efficiency by reducing power consumption.

To attain the above-mentioned object, this invention provides a novel amplifier which is able to issue a slightly amplified signal in a small signal input condition as well as a greatly amplified signal in a large signal input condition; and is provided with drive circuit means adapted for being supplied with both input signals, and judgment means distinguishes whether the drive circuit means is issuing an amplified signal; of the small input signal or the large input signal. The slightly amplified signal corresponding to the small input signal is amplified by a first power amplifying circuit means. The greatly amplified signal corresponding to the large input signal is amplified by a second power amplifying circuit means; the second power amplifying circuit means and the drive circuit means are impressed with first power source voltage from first power supply means; second power supply means supplies the first power amplifying circuit means with second power source voltage lower than the first power source voltage; and an output signal is issued to the load from a connection node of output terminals of the first and second power amplifying means.

With the amplifier embodying this invention which is arranged as described above, only the first power amplifying circuit means which is impressed with a low power source voltage to amplify the input signal of small amplitude is actuated in the small signal input condition, thereby improving the power efficiency by reducing power consumption. In the large signal input condition, the second power amplifying circuit means which is impressed with high voltage to amplify the input signal of large amplitude is actuated. Therefore, it is possible to assure a sufficiently broad dynamic range.

DETAILED DESCRIPTION OF THE PREFERRED EMBODIMENTS

Figure 1:
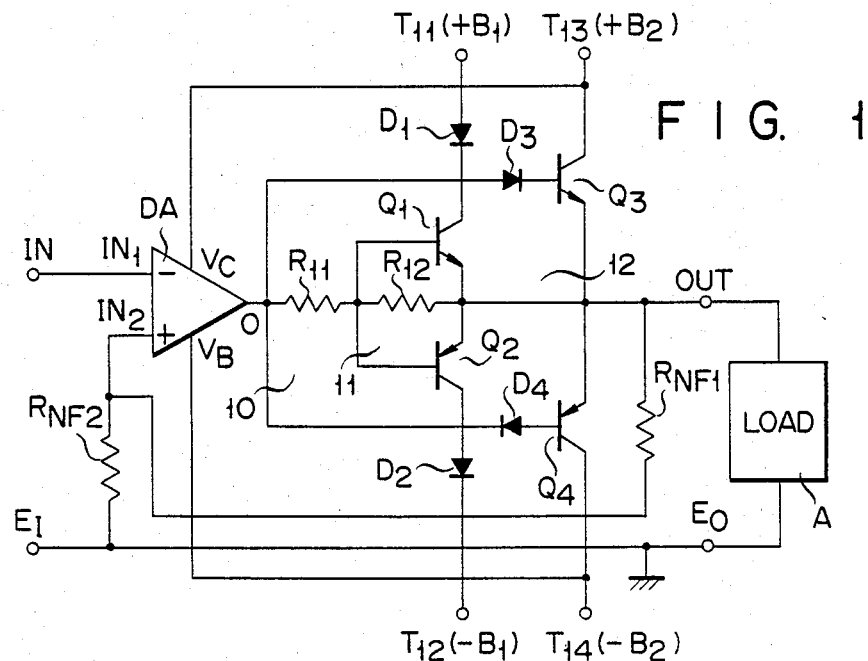
FIG. 1 shows a circuit arrangement of an amplifier according to a first embodiment of this invention.

Referring to FIG. 1, reference characters IN, $E_I$ denote the input terminals to which an error detector (not shown) supplies a prescribed error signal such as a focusing error signal or tracking error signal for the DAD player, for example. The input terminal IN is connected to the inverted input terminal $IN_1$ of a differential amplifier DA of the driving section. The noninverted input terminal $IN_2$ of the differential amplifier DA is connected to the output terminal OUT (to be described later) through a first feedback resistor $R_{NF1}$, and also to the other terminal $E_I$ through a second feedback resistor $R_{NF2}$. Positive and negative power input terminals $V_C$, $V_B$ of the differential amplifier DA are respectively connected to positive and negative power sources $+B_2$, $-B_2$ (not shown) through the later described corresponding terminals $T_{13}$, $T_{14}$.

A load A consisting of the aforesaid actuators in connection between the output terminal OUT and terminal $E_O$. The node connecting the terminals $E_O$, $E_I$ is grounded. The output terminal O of the differential amplifier DA is connected through a resistor $R_{11}$ to the common bases of complementary transistors $Q_1$, $Q_2$ of a first SEPP amplifier constituting a small amplitude signal-amplifying section 11 acting as a first power amplifying means. A resistor $R_{12}$ is connected between a connection node of the bases and a connection node of emitters of the transistors $Q_1$, $Q_2$. The connection node of the emitters is connected to the output terminal OUT. The collector of the transistor $Q_1$ is connected to the cathode of a diode $D_1$. The collector of the other transistor $Q_2$ is connected to the anode of a diode $D_2$. The anode of the diode $D_1$ is connected to a positive power source $+B_1$ (not shown) through a terminal $T_{11}$. The cathode of the diode $D_2$ is connected to a negative power source $-B_1$ (not shown) through a terminal $T_{12}$.

The output terminal O of the differential amplifier DA is connected to the anode of a diode $D_3$ and the cathode of a diode $D_4$. The cathode of the diode $D_3$ is connected to the base of a transistor $Q_3$. The anode of the diode $D_4$ is connected to the base of a transistor $Q_4$ complementary to the transistor $Q_3$ and forming a second SEPP amplifier therewith. The transistors $Q_3$, $Q_4$ of the second SEPP amplifier jointly constitute a large amplitude signal-amplifying section 12 acting as a second power amplifying means. Emitters of the transistors $Q_3$, $Q_4$ are connected to the output terminal OUT. The collector of the transistor $Q_3$ and the positive power input terminal $V_C$ of the differential amplifier DA are connected to a positive power source $+B_2$ (not shown) through a terminal $T_{13}$. The collector of the transistor $Q_4$ and the negative power input terminal $V_B$ of the differential amplifier DA are connected to a negative power source $-B_2$ (not shown) through a terminal $T_{14}$.

The positive and negative power sources $+B_1$, $-B_1$, $+B_2$, $-B_2$ are assumed to satisfy the relationship given below:

$+B_2 > +B_1$ $-B_2 > -B_1$ if the referential characters concurrently denote the voltages of the power sources.

With the amplifier of FIG. 1 according to a first embodiment of this invention which is arranged as described above, an error signal from the error detector is supplied between the terminals IN, $E_I$. The error signal is amplified by the differential amplifier DA of the driving section. When an amplitude of the error signal is small in the normal condition, for example, the amplified signal corresponding to the small error input signal is fed to the small amplitude signal-amplifying section 11 acting as the first power amplifying section only to an extent equal to the gain defined by the first and second feedback resistors $R_{NF1}$, $R_{NF2}$. Later the power amplified error signal is supplied to the output terminal OUT. An output signal from the output terminal OUT drives the load A to move the object lens of the optical pickup of, the DAD player in the direction perpendicular to the DAD plane, to thereby achieve focusing control. At the same time, the laser reflector is rotated about its axis by the load A, to thereby move the laser beam spot on the disc in the radial direction of the DAD to achieve tracking control. In the above-mentioned case, the transistors $Q_3$, $Q_4$ of the second SEPP amplifier constituting the large amplitude signal-amplifying section 12 remain disabled and shut off by the forward voltages of the diodes $D_3$, $D_4$ which constitute amplitude judging means 10 together with the resistors $R_{11}$, $R_{12}$. When the small amplitude signal is supplied, therefore, power supplied from the positive source $+B_2$ and negative source $-B_2$ is only consumed by the differential amplifier DA acting as drive means, thus avoiding excessive power consumption.

Now, when the subject amplifier is brought to an abnormal condition due to mechanical external vibrations being imparted to, for example, the DAD player, the pickup (not shown) vibrates abnormally and the error detector (not shown) supplies an error signal of large amplitude between the input terminals IN, $E_I$. Then the transistors $Q_3$, $Q_4$ constituting the large amplitude signal-amplifying section 12 acting as the second power amplifying means are actuated by the differential amplifier DA acting as the drive means through the diodes $D_3$, $D_4$. Since, in this case, an error signal with sufficient power is supplied to the load A, such as an actuator, through the output terminal OUT, it is possible to easily control the position of the object lens or the reflector. Therefore, the amplifier of this invention is adapted to drive the load A, even when the large amplitude signal having an excessively broad dynamic range is supplied, though the amplifier normally consumes little power when the small amplitude signal is supplied. The diodes $D_1$, $D_2$, when supplied with the error signal of large amplitude, suppress a back flow of current due to the power sources $+B_2$, $-B_2$ to the power sources $+B_1$, $-B_1$ of the transistors $Q_1$, $Q_2$.

In foregoing description, forward voltages impressed on the base-emitter regions of the transistors $Q_1$, $Q_2$ were disregarded to facilitate understanding. Where the differential amplifier DA actually issues a very small output, the transistors $Q_1$, $Q_2$ remain shut off. The result is that both signal amplifier sections 11, 12 remain shut off. When, therefore, an error signal of very small amplitude is received, the load A is driven only by the output from the differential amplifier DA through the resistors $R_{11}$, $R_{12}$ and the output terminal OUT in turn.

Description will now be given with reference to FIG. 2 of a modification of the amplifier of FIG. 1. The parts of FIG. 2 that are the same as those of FIG. 1 are denoted by the same numerals and descriptions thereof are omitted.

A resistor $R_{13}$ is connected between the terminal $T_{13}$ and the collector of the transistor $Q_3$. The resistor $R_{13}$ and the collector of the transistor $Q_3$ is grounded through a capacitor $C_{11}$. A resistor $R_{14}$ is connected between the terminal $T_{14}$ and the collector of the transistor $Q_4$. The resistor $R_{14}$ and the collector of the transistor $Q_4$ is grounded through a capacitor $C_{12}$.

According to the above-mentioned arrangement, the capacitors $C_{11}$, $C_{12}$ compensate excessively broad dynamic range of momentarily large amplitude signal; and the resistors $R_{13}$, $R_{14}$ narrow the amplitude of a large amplitude signal issued for long time, thereby protecting the load A.

Description will now be given with reference to FIG. 3 of another amplifier which assures the same effect as that of FIG. 1. The parts of FIG. 3 which are the same as those of FIG. 1 are denoted by the same numerals, descriptions thereof being omitted. Referring to FIG. 3, the collectors of the transistors $Q_1$, $Q_2$ are respectively connected to the bases of transistors $Q_{11}$, $Q_{12}$ of the opposite conductivity type to the transistors $Q_1$, $Q_2$. Collectors of the transistors $Q_{11}$, $Q_{12}$ are commonly connected to the output terminal OUT. Emitters of the transistors $Q_{11}$, $Q_{12}$ are connected to the corresponding terminals $T_{11}$, $T_{12}$ through the corresponding diodes $D_1$, $D_2$. That is, transistors $Q_1$, $Q_{11}$ and $Q_1$ and $Q_{12}$ are each connected in the Darlington form. In FIG. 3, the resistor $R_{12}$ used in FIGS. 1 and 2 is omitted.

The output terminal O of the differential amplifier DA is connected to the bases of the transistors $Q_3$, $Q_4$, which in turn are connected to transistors $Q_{13}$, $Q_{14}$ of the same conductivity type in the Darlington form. Collectors of the transistors $Q_3$, $Q_{13}$ and the power input terminal $V_C$ of the differential amplifier DA are connected to the terminal $T_{13}$. Collectors of the transistors $Q_4$, $Q_{14}$ and the power input terminal $V_B$ of the differential amplifier DA are connected to the terminal $T_{14}$. In FIG. 3, the transistors $Q_3$, $Q_4$ concurrently amplify the output signal from the differential amplifier DA and perform the same function as the diodes $D_3$, $D_4$ of FIG. 1. A capacitor $C_{21}$ connected in parallel to the resistor $R_{NF3}$ carries out phase compensation in a high frequency region. In the case of FIG. 3, it is possible to insert a parallel circuit of a resistor and a capacitor between the output terminal OUT and the load A, thereby carrying out protection of the load A and phase compensation in a high frequency region.

Figure 2:
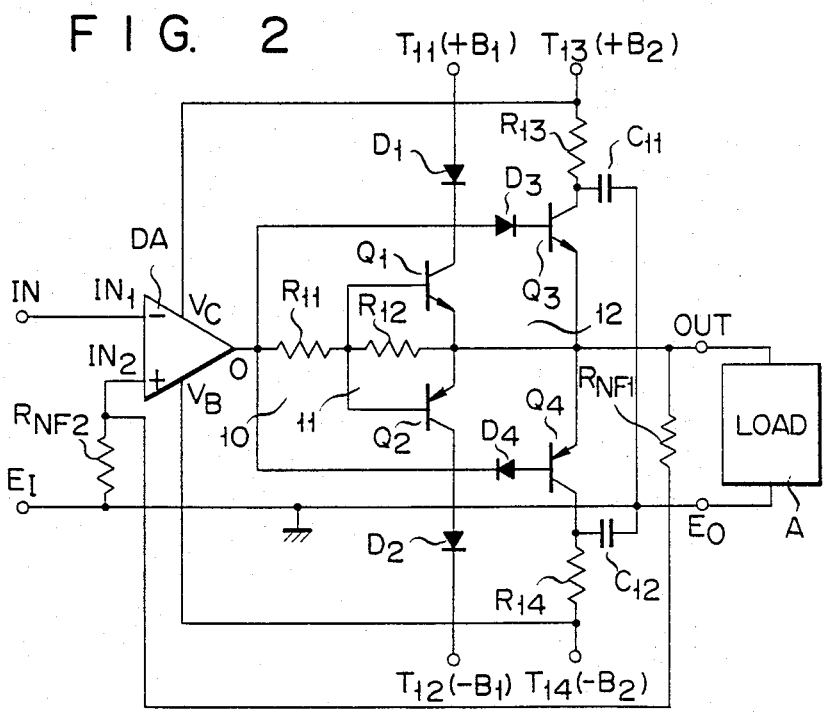
FIG. 2 and FIG. 3 indicate circuit arrangements of an amplifier according to second and third embodiments of the invention.
Figure 3:
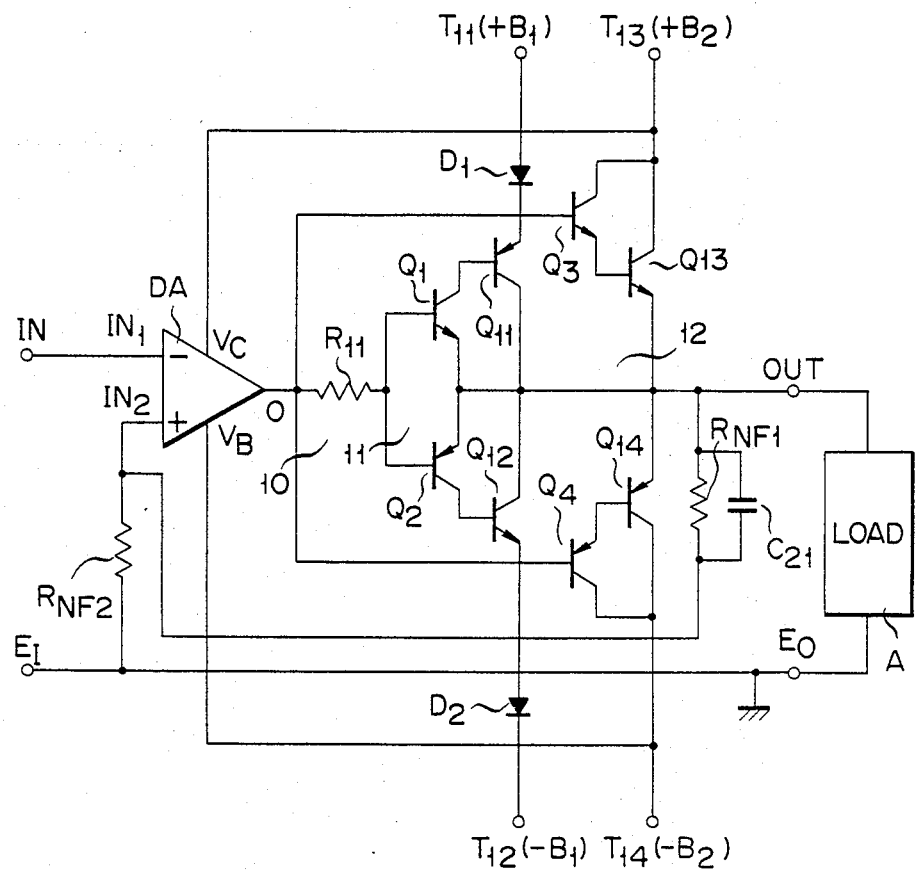

The embodiments of FIGS. 1, 2 and 3 refer to the case wherein only the small amplitude signal-amplifying section 11 and the large amplitude signal-amplifying section 12 were provided. However, it is possible to apply, for example, three or more amplifying sections by providing an intermediate signal-amplifying section in addition to the above-mentioned amplifying sections 11, 12. The above-mentioned amplifier is adapted not only to drive actuators constituting the autofocusing control mechanism and autotracking control mechanism of the DAD player, but also to drive general loads requiring a sufficiently broad dynamic range, for example, actuators constituting other mechanisms. Obviously, this invention is applicable with various changes and modifications without departing from the scope and object of the invention. As mentioned above, therefore, the invention provides an amplifier which is improved to assure a sufficiently broad dynamic range and efficient power utilization by reducing power consumption.

What is claimed is:

1. An amplifier comprising:
   input and output terminals;
   drive circuit means for receiving a signal from said input terminal and providing a drive signal at an output thereof;
   judging means, having first and second resistors coupled in series between said drive circuit means output and said amplifier output terminal and first and second diodes, each having a first end commonly connected to said drive circuit means output, for judging an amplitude of said drive signal;
   first power amplifying circuit means, including a first pair of complementary transistors having their bases commonly connected to the junction of said first and second resistors and their emitters commonly connected to said amplifier output terminal, for amplifying said drive signal;
   second power amplifying circuit means, including a second pair of complementary transistors having their bases respectively connected to respective second ends of said first and second diodes and their emitters commonly connected to said amplifier output terminal, for amplifying said drive signal;
   first power supply means for supplying positive and negative first source voltages ($+B_1$, $-B_1$) to the respective collectors of said first pair of complementary transistors; and
   second power supply means for supplying positive and negative second source voltages ($+B_2$, $-B_2$) to the respective collectors of said second pair of complementary transistors, said first and second source voltages satisfying:
   $+B_2 > +B_1$ and $-B_2 < -B_1$, whereby said second power amplifying circuit means amplifies said drive signal only when said drive signal is greater than a predetermined level.

2. The amplifier according to claim 1, wherein the second power amplifying circuit means comprises a capacitor means for compensating dynamic range for a momentarily large amplitude signal and resistor means for narrowing the amplitude of the large amplitude signal supplied for a long time.

3. The amplifier according to claim 1, wherein said first power amplifying circuit means comprises a diode for suppressing a back flow of current to the first power supply means when the large amplitude signal is received.

* * * * *